(12) United States Patent
Watson

(10) Patent No.: US 6,603,347 B2
(45) Date of Patent: Aug. 5, 2003

(54) AMPLIFIER HAVING CONTROLLABLE INPUT IMPEDANCE

(75) Inventor: Ian Watson, Swindon (GB)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/158,915

(22) Filed: Jun. 3, 2002

(65) Prior Publication Data

US 2002/0190784 A1 Dec. 19, 2002

Related U.S. Application Data

(63) Continuation of application No. 09/590,364, filed on Jun. 9, 2000, now abandoned.

(30) Foreign Application Priority Data

Jun. 10, 1999 (GB) .............................................. 9913548

(51) Int. Cl.[7] ................................................ G06K 7/12
(52) U.S. Cl. ....................... 327/560; 327/312; 327/574; 330/271; 330/282; 330/291
(58) Field of Search ................. 327/560, 574, 327/576, 581, 562, 306, 312, 313, 316, 323, 363, 419, 427; 330/262–267, 269–271, 277, 278, 282, 291, 83; 331/116 FE

(56) References Cited

U.S. PATENT DOCUMENTS

| 3,392,341 A | * | 7/1968 | Burns .......................... 327/581 |
| 3,872,390 A |   | 3/1975 | Nash ........................... 330/264 |
| 3,986,041 A |   | 10/1976 | Buckley, III et al. ........ 326/121 |
| 4,068,090 A | * | 1/1978 | Komatsu et al. ............ 330/277 |
| 4,322,694 A | * | 3/1982 | Morihisa ............... 331/116 FE |
| 4,439,741 A |   | 3/1984 | Turner, Jr. ................... 330/149 |
| 4,446,443 A |   | 5/1984 | Johnson et al. ............. 330/257 |
| 4,618,814 A |   | 10/1986 | Kato et al. .................. 323/280 |
| 5,192,920 A |   | 3/1993 | Nelson et al. ............... 330/277 |
| 5,221,910 A | * | 6/1993 | Tournier ...................... 330/264 |
| 5,574,405 A |   | 11/1996 | Razavi .......................... 331/2 |
| 5,721,500 A |   | 2/1998 | Karanicolas ................. 327/113 |

FOREIGN PATENT DOCUMENTS

| EP | 0 397 335 | 11/1990 |
| EP | 0 417 985 | 3/1991 |

(List continued on next page.)

OTHER PUBLICATIONS

J. Millman et al., "Integrated Electronics: Analog and Digital Circuits and Systems", 1972, McGraw–Hill Kogakusha, Ltd., Tokyo XP002146631 pp 408–425.

P.E. Allen et al., "CMOS Analog Circuit Design", 1987, Holt, Rinehart and Winston, Inc., New York XP002146632 pp 299–314 Figs. 6.4–8.

*Primary Examiner*—Timothy P. Callahan
*Assistant Examiner*—Minh Nguyen
(74) *Attorney, Agent, or Firm*—Burns, Doane, Swecker & Mathis, L.L.P.

(57) ABSTRACT

An amplifier circuit includes a circuit input, and a circuit output. An inverter, including first and second MOS transistors is connected between first and second supply voltages, and has an inverter input connected to the circuit input, and an inverter output, which provides an inverter output current corresponding to a circuit input voltage. A first resistive element comprises a third MOS transistor and a fourth MOS transistor of opposite conductivity types, and each having their gate and drain terminals connected to the inverter output and the circuit output, and having their respective source terminals connected to respective ones of the first and second supply voltages. A second resistive element includes a fifth MOS transistor and a sixth MOS transistor of opposite conductivity types, and each having its drain-source path connected between the circuit output and the circuit input, and having its gate connected to a respective voltage source.

10 Claims, 6 Drawing Sheets

FOREIGN PATENT DOCUMENTS

| | | |
|---|---|---|
| EP | 0 438 706 | 7/1991 |
| EP | 0480815 | 4/1992 |
| EP | 0561336 | 9/1993 |
| EP | 762662 | 3/1997 |
| EP | 789450 | 8/1997 |
| FR | 2 365 263 | 4/1978 |
| GB | 2241621 | 9/1991 |
| WO | 84/00258 | 1/1984 |

* cited by examiner

//AMPLIFIER HAVING CONTROLLABLE
INPUT IMPEDANCE

This application is a continuation of application Ser. No. 09/590,364, filed on Jun. 9, 2000 now abandoned.

TECHNICAL FIELD OF THE INVENTION

This invention relates to an amplifier circuit, and in particular to an amplifier which is suitable for use at radio frequencies, and is suitable for integration using CMOS fabrication techniques, with low supply voltages. As such, the device is suitable for use in hand-held portable radio devices, such as mobile phones, for example.

BACKGROUND OF THE INVENTION

Amplifier circuits, such as those shown in FIG. 1, are known which include a first pair of CMOS transistors 16, 18 in an inverter structure 12, with the inverter output 20 supplied to the amplifier output terminal 22. The input voltage 14, supplied to the inverter input, produces an output current which depends on the transconductances of the transistors 16, 18. The amplifier output terminal is also connected to the gate terminals and to the drain terminals of two further CMOS transistors 24, 26. The output current is drawn through these transistors 24, 26, which act as resistors, in that the current through their drains depends on their gate voltages. The gate voltages, and hence the amplifier output 22, therefore depend on the output current.

As a result, by designing the circuit such that the first pair of transistors are larger than the second pair, an inverting amplifier having a gain greater than unity can be obtained.

FIG. 2 shows a small signal model for such a circuit, in which transistors 24 and 26 have each been represented by their equivalent resistances.

The current $i_T$ flowing from the output to the drain of each of the transistors 16, 18 is given by:

$$i_T = g_{m16} \cdot V_i + g_{m18} \cdot V_i = V_i(g_{m16} + g_{m18})$$

Thus, $$V_o = \frac{-1}{g_{m24} + g_{m26}} \cdot V_i(g_{m16} + g_{m18})$$

$$\therefore A_v = \frac{V_o}{V_i} = -\left(\frac{g_{m16} + g_{m18}}{g_{m24} + g_{m26}}\right),$$

where $A_v$ is the voltage gain of the circuit.

Normally, the devices are chosen such that $g_{m16} = g_{m18}$, and $g_{m24} = g_{m26}$ and set such that $g_{m16} = K \cdot g_{m26}$
Thus, $$A_v = -\frac{g_{m16}}{g_{m24}} = -K$$

where, $g_m = \sqrt{2\beta I_D}$, $I_D$ Being the current through a device, so $$A_v = \sqrt{\frac{I_{D_{16}}}{I_{D_{24}}}} = K$$

The ratio of currents between transistors 16/18 and transistors 24/26 is set to $$\frac{I_{D_{16/18}}}{I_{D_{24/26}}} = K^2$$

For a low-noise amplifier, there are two requirements which are of particular note here. Firstly, it is preferable to match the signal source impedance to the amplifier input impedance, to provide optimum power transfer to the output. Secondly, it is necessary to have a good noise figure, for example of 2 dB or less. However, matching the signal source impedance to the amplifier input impedance produces a noise figure of at least 3 dB, which means that it is not possible to produce an acceptable noise performance.

SUMMARY OF THE INVENTION

The present invention provides an amplifier circuit which is suitable for integration using CMOS techniques, and for use at radio frequencies, while providing good performance in terms of its noise figure.

According to a first aspect of the present invention, there is provided an amplifier circuit, comprising:

a circuit input, and a circuit output;

an inverter connected between first and second supply voltages, and having an inverter input connected to the circuit input, and an inverter output, and providing an inverter output current corresponding to a circuit input voltage;

a first resistive element connected to the inverter output and to the circuit output, and providing a voltage output corresponding to the inverter output current; and a second resistive element providing a feedback resistance between the circuit output and the circuit input, the feedback resistance being adjustable such that the active input impedance of the amplifier can be set to any required value.

According to another aspect of the invention, there is provided an amplifier circuit, comprising:

a circuit input, and a circuit output;

an inverter, comprising first and second MOS transistors (16,18) connected between first and second supply voltages, and having an inverter input connected to the circuit input, and an inverter output, and providing an inverter output current corresponding to a circuit input voltage;

a first resistive element, comprising at least a third MOS transistor (24 or 26), connected to the inverter output and to the circuit output, and providing a voltage output corresponding to the inverter output current; and a second resistive element, comprising at least a fourth MOS transistor (30 or 32), having its drain and source terminals connected between the circuit output and the circuit input, and having its gate connected to a voltage source to have a voltage applied thereto such that the fourth MOS transistor operates in its linear region.

According to another aspect of the invention, there is provided an amplifier circuit, comprising:

a circuit input, and a circuit output;

an inverter, comprising first and second MOS transistors (16, 18) connected between first and second supply voltages, and having an inverter input connected to the circuit input, and an inverter output, and providing an inverter output current corresponding to a circuit input voltage; and a resistive element comprising third and fourth MOS transistor (30,32), being of opposite conductivity types, each having its drain source path connected between the circuit output and the circuit input, and having its gate connected to a respective voltage source to have a voltage applied thereto such that it operates in its linear region.

According to another aspect of the invention, there is provided an amplifier circuit, comprising:

a circuit input, and a circuit output;

an inverter, comprising at least a first MOS transistor (16 or 18) connected between the circuit output and a first supply voltage, and having an inverter input connected to the circuit input, and an inverter output, and providing an inverter output current corresponding to a circuit input voltage;

a first resistive element, comprising a second MOS transistor (24 or 26), having its gate and drain connected to the inverter output and to the circuit output, and its source connected to the first supply voltage, providing a voltage output corresponding to the inverter output current;

a second resistive element, comprising third and fourth MOS transistors (30,32), the third and fourth transistors being of opposite conductivity types, and each having its drain-source path connected between the circuit output and the circuit input, and having its gate connected to a respective voltage source; and, a third resistive element connected between the circuit output and a second supply voltage.

BRIEF DESCRIPTION OF DRAWINGS

For a better understanding of the present invention, and to show more clearly how it may be carried into effect, reference will now be made, by way of example, to the accompanying drawings, in which.

DETAILED DESCRIPTION OF THE INVENTION

Figure 3:
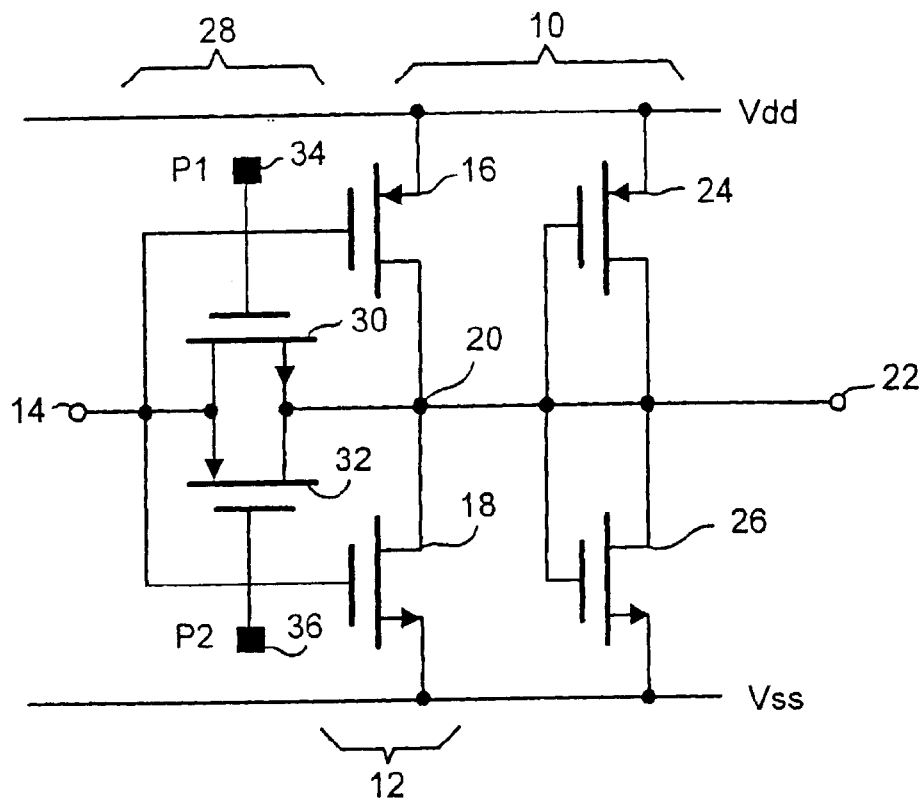
FIG. 3 is a circuit diagram of an amplifier circuit according to a first aspect Of the present invention.

FIG. 3 shows an amplifier circuit in accordance with the invention.

The circuit is based around an amplifier 10 of known type as mentioned above in relation to FIG. 1, which includes an inverter 12. A circuit input 14 is connected to the gate terminals of a first PMOS transistor 16 and a second NMOS transistor 18. The PMOS transistor 16 has its source terminal connected to a positive supply voltage Vdd, and its drain terminal connected to an inverter output 20. The NMOS transistor 18 has its source terminal connected to a negative supply voltage Vss, and its drain terminal connected to the inverter output 20.

The inverter output terminal 20 is also connected to the circuit output 22. A third PMOS transistor 24 has its source terminal connected to a positive supply voltage Vdd, and its gate and drain terminals connected to the inverter output 20. A fourth NMOS transistor 26 has its source terminal connected to a negative supply voltage Vss, and its gate and drain terminals connected to the inverter output 20.

Thus, an input voltage applied at the input terminal 14 produces a corresponding current flowing at the inverter output 20, the size of which depends on the transconductances of the first and second transistors 16, 18.

The currents in the drains of the third and fourth transistors 24, 26, conversely, depend on the gate voltages of those transistors. The gate voltages of these transistors, and hence also the circuit output voltage at the output terminal 22, therefore takes a value which produces the required currents.

If the third and fourth transistors 24, 26 are matched with the first and second transistors 16, 18, the gate voltage of the third and fourth transistors (that is, the circuit output voltage) is equal to the gate voltage of the first and second transistors (that is, the circuit input voltage) and so the amplifier circuit 10 inverts the input with unity gain.

If, by contrast, the third and fourth transistors 24, 26 are smaller than the first and second transistors 16, 18 by a particular factor, then the currents in the third and fourth transistors are correspondingly smaller than those in the first and second transistors. This produces a given ratio in the transconductance between the first and second, and the transconductance of the third and fourth transistors, and the amplifier gain has the same factor.

The third and fourth transistors act as a resistive element, producing an output voltage which depends on the current supplied thereto.

The circuit of FIG. 3 also includes a feedback section 28, which includes a fifth NMOS transistor 30 and a sixth PMOS transistor 32. The gate of the fifth NMOS transistor 30 is connected to a control voltage P1 at a terminal 34, its source terminal is connected to the circuit output terminal 22, and its drain terminal is connected to the circuit input terminal 14. The gate of the sixth PMOS transistor 32 is connected to a control voltage P2 at a terminal 36, its source terminal is connected to the circuit input terminal 14, and its drain terminal is connected to the circuit output terminal 22.

The control voltages P1, P2 are selected such that they bias the fifth and sixth transistors 30, 32 to operate in their linear region, where they behave in a resistive manner. The voltages P1 and P2 will be within the range of the supply voltages Vss to Vdd. Typically, P1 will be in the range:

$(Vdd+Vss)/2 < P1 < Vdd$

, and P2 will typically be in the range:

$Vss \leq P2 \leq (Vdd+Vss)/2$

Therefore, the control voltages P1, P2 are typically above and below the mid supply voltage, respectively.

Moreover, the effective resistance values of these devices can be controlled by the applied control voltages. However, the resistance values will be sufficiently high that no, or negligible, current will flow in the transistors, meaning that there will be no, or negligible, voltage drop across them, and the DC voltage at the input terminal 14 will be biassed to the DC level at the circuit output 22. That is, the resistive devices 30, 32 allow current to flow between the output 22 and the input 14, such that the input 14 will be charged until its voltage is equal to the voltage of the output 22. This is the DC quiescent operating point. Application of a signal to the input will cause a difference between the voltages on input 14 and output 22, thus causing a current to flow through devices 30, 32.

In principle, the fifth and sixth transistors 30, 32 could be replaced by one or more resistors, but it is not possible to fabricate resistors with sufficient accuracy in a CMOS process for this to be a useful option. Moreover, the circuit of FIG. 3 allows the option of controlling the resistance by adjusting the control voltages P1, P2.

In cases where no adjustment of the input impedance is required, it is also possible to connect the gates of the fifth and sixth transistors to the first and second voltage supply rails respectively. The sizes of the fifth and sixth transistors can then be designed to provide the required amplifier parameters.

Figure 4:
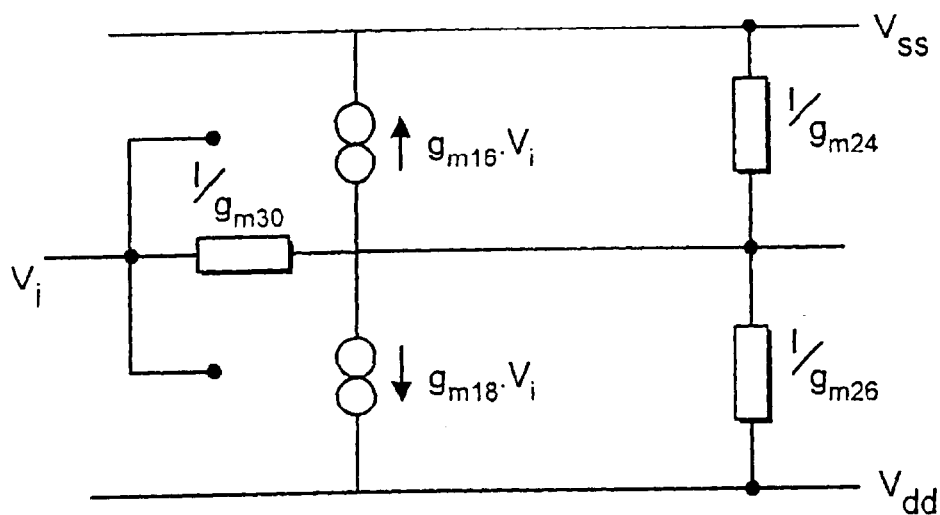
FIG. 4 shows a small signal model of the circuit of FIG. 3.

The gain of the circuit of FIG. 3 is represented in the small signal model shown in FIG. 4.

In FIG. 4, $$V_o(g_{m_{24}}+g_{m_{26}})+V_i(g_{m_{16}}+g_{m_{18}})+(V_o-V_i)g_{m_{30}}=0$$

$$V_o(g_{m_{24}}+g_{m_{26}}+g_{m_{30}})=-V_i(g_{m_{16}}+g_{m_{18}}-g_{m_{30}})$$

Therefore, $$A_v = \frac{V_o}{V_i} = -\left(\frac{g_{m_{16}} + g_{m_{18}} - g_{m_{30}}}{g_{m_{24}} + g_{m_{26}} + g_{m_{30}}}\right)$$

Figure 5:
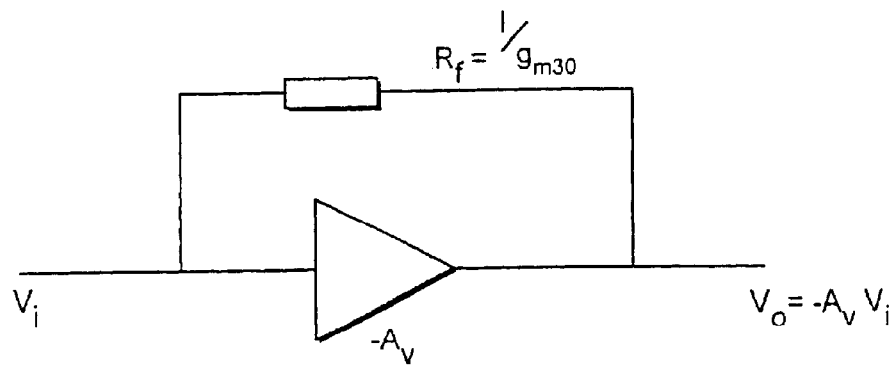
FIG. 5 represents the input resistance of FIG. 3.

The input resistance of the circuit of FIG. 3 is shown in FIG. 5.

$$R_{IN} = \frac{R_f}{1 + A_v}$$

Therefore, $R_{IN} = \frac{1/g_{m_{30}}}{1 + A_v}$

The input resistance can be matched to the source impedance (for example 50 Ω) to provide optimum power matching.

Figure 1:
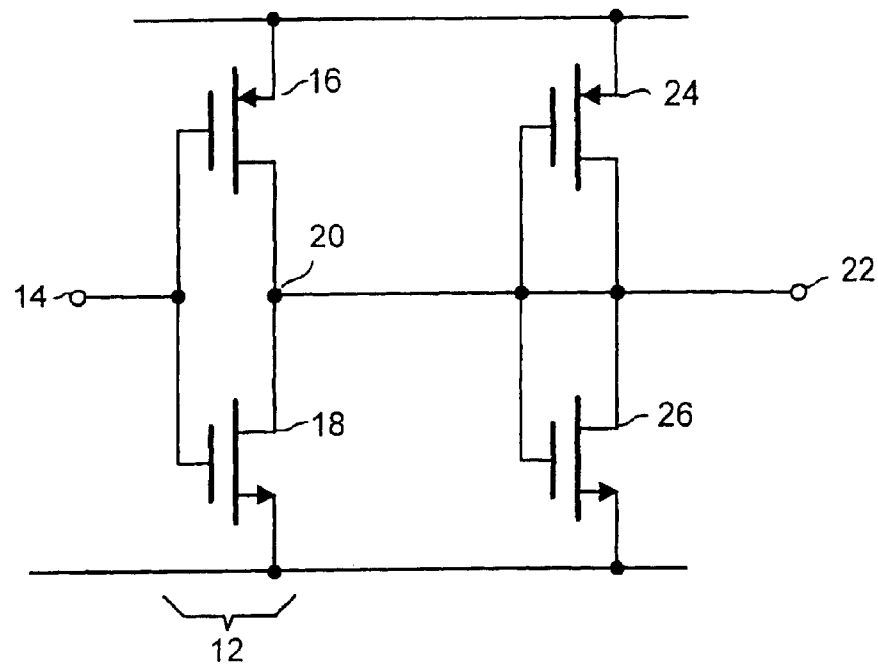
FIG. 1 shows an amplifier circuit in accordance with the prior art.
Figure 2:
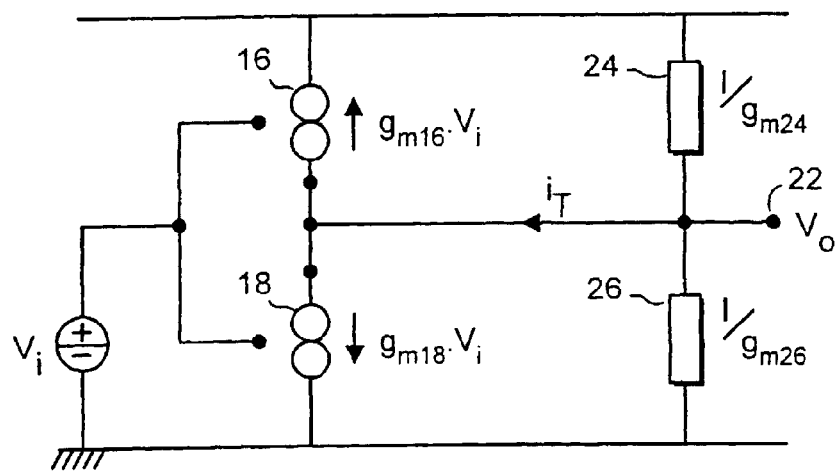
FIG. 2 shows a small signal model for the circuit of FIG. 1.

However, from a noise point of view, the noise factor of the circuit of FIG. 3 is much lower than that of FIG. 1.

Figure 6:
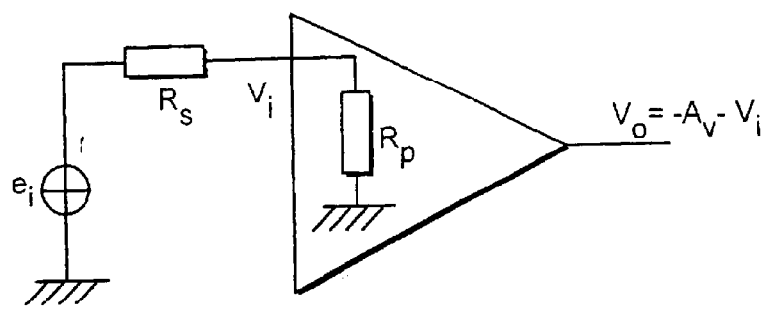
FIG. 6 represents the circuit of FIG. 1 for noise analysis.

For the purposes of noise analysis, the circuit of FIG. 1 may be represented by FIG. 6, where $R_p$ is the input resistance of $M_{16/18}$ (mainly poly resistance of the gates).

Figure 7:
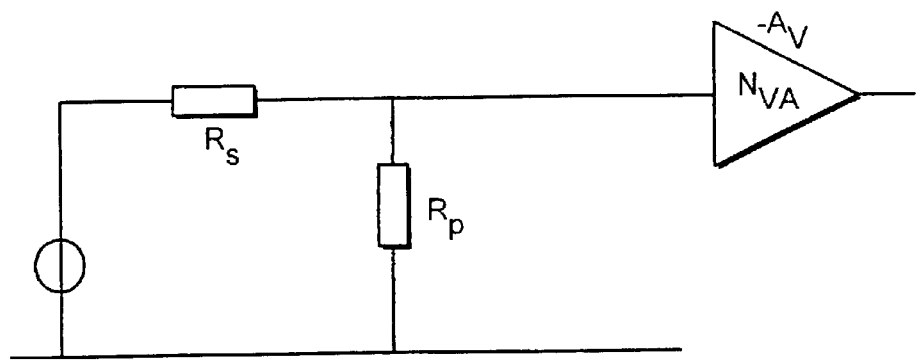
FIG. 7 represents the noise of the circuit of FIG. 1.
Figure 8:
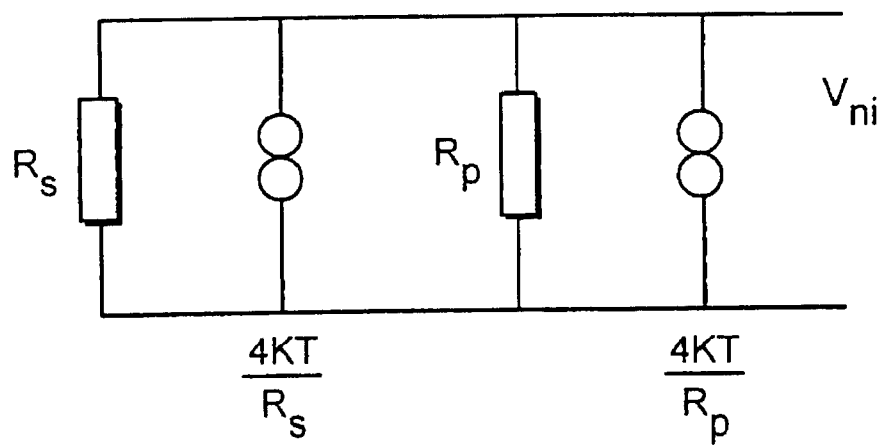
FIG. 8 represents the noise factor of the circuit of FIG. 1.

The noise of the amplifier can be represented by $N_{VA}$, as shown in FIG. 7, resulting in a noise factor represented by FIG. 8, in which the source resistance is represented by $R_S$.

$$\overline{V}_{ni}^2 = \frac{4KT}{R_p} \cdot (R_S // R_P)^2 + \frac{4KT}{R_S}(R_S // R_P)^2$$

where K is Boltzmann's constant and T is the temperature.

Normally, for power match, $R_p = R_S$

Therefore, $$\overline{V}_{ni}^2 = \frac{4KT}{R_p} \cdot \left(\frac{R_p}{2}\right)^2 \cdot 2$$

-continued $$\overline{V}_{ni}^2 = 2 \cdot KT \cdot R_p$$

and the Noise Factor, F, equals:

$$F = \frac{(2 \cdot K \cdot T \cdot R_p + N_{VA})}{KTR_p \cdot A_V^2} \cdot A_v^2$$

$$F = 2 + \frac{N_{VA}}{KTR_p}$$

Thus, in the circuit of FIG. 1, F must be greater than two.

Figure 9:
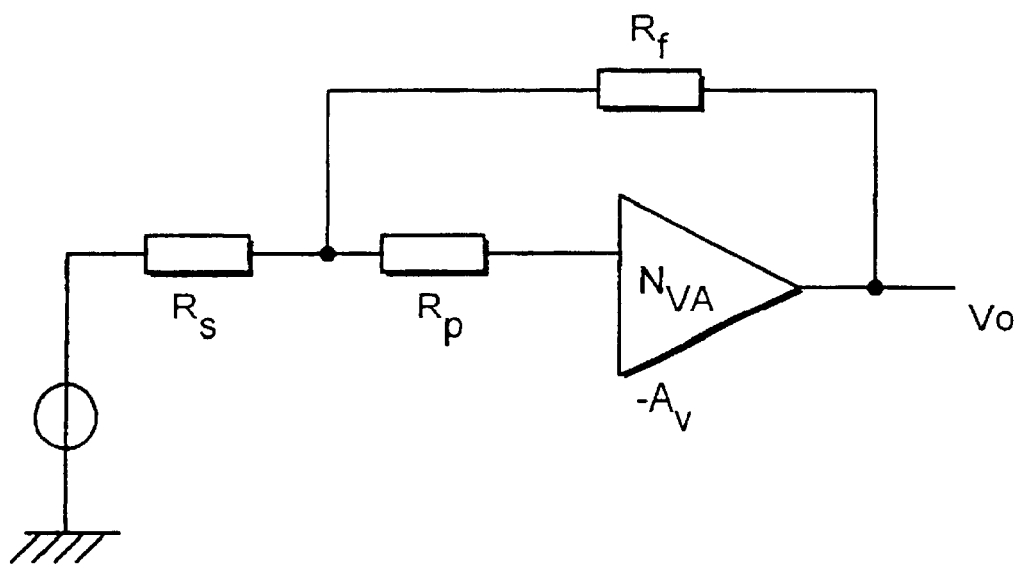
FIG. 9 represents the circuit of FIG. 3 for noise analysis.

In comparison, for the purposes of noise calculations, the circuit of FIG. 3 may be represented by FIG. 9.

The input impedance is set by feedback resistor $R_f$, where $$R_S = \frac{R_f}{1 + A_V},$$

to provide power match

Figure 10:
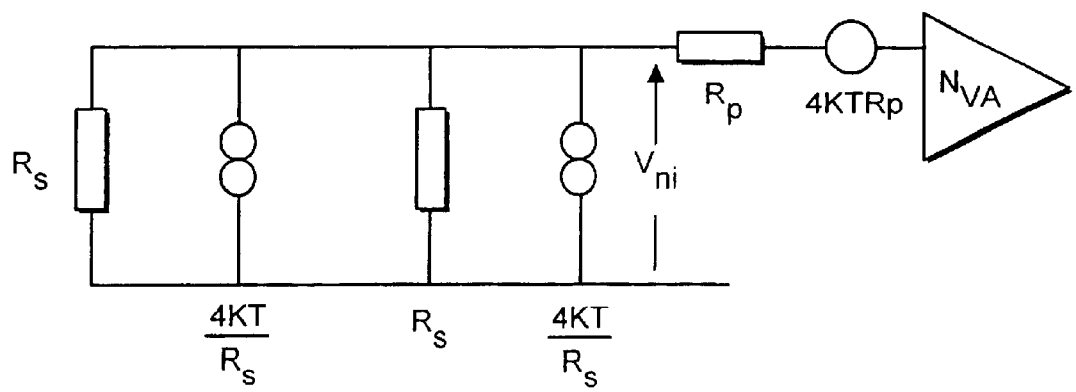
FIG. 10 represents the noise factor of FIG. 3.

Thus, the noise factor is as given in FIG. 10.

$$\overline{V}_{ni}^2 = \frac{4KT}{R_S} \cdot \left(\frac{R_S}{2}\right)^2 + \frac{4KT}{R_f} \cdot \left(\frac{R_S}{2}\right)^2 = KT\left(R_S + \frac{R_S}{R_f}\right)^2$$

So, assuming $R_f \approx A_V \cdot R_S$ $$\overline{V}_{ni}^2 = KT\left(R_S + \frac{R_S}{A_V}\right) = KTR\left(1 + \frac{1}{A_V}\right)$$

Therefore, noise factor $$F = \frac{KTR_S\left(1 + \frac{1}{A_V}\right) + 4KTR_p + N_{VA}}{KT \cdot R_S}$$

$$F = 1 + \frac{1}{A_V} + \frac{4R_p}{R_S} + \frac{N_{VA}}{KTR_S}$$

If, for example, Av is 10, Rp is 5 Ω and Rs is 50 Ω, then, $F=1+0.1+(4\times5)/50+N_{VA}/KTR_S=1+0.5+N_{VA}/KTR_S=1.5+N_{VA}/KTR_S$ According to the circuit of FIG. 1, the noise figure was $N_{VA}/KTRp$, whereas now it includes Rs which is ten times larger than Rp, so that the noise factor is reduced in value.

For example, if $N_{VA}=K.T.25$

Noise figure of FIG. 1=2+(K.T.25/K.T.5)

$F=7$(8.4 dB)

Noise figure of FIG. 3=1.5+(K.T.25/K.T.50)

$F=2$(3.0 dB)

Thus, as mentioned above, the circuit of FIG. 3 has a much better noise factor than that of FIG. 1.

For any value of the gain from the circuit input to output, the resistance value of the feedback transistors 30, 32 can be set to give any desired value of the active input impedance. The transistor parameters, such as the device sizes, can be designed to provide the required amplifier parameters such as gain and input impedance. Further, the transistor resistances can be controlled in the circuit of FIG. 1 by adjusting the gate voltages.

The circuit of FIG. 3 shows fifth and sixth transistors 30, 32 in the feedback loop connecting the output to the input. However, depending on the required feedback resistance, it may be possible to provide just one such transistor.

Further, or alternatively, either of the third and fourth transistors 24, 26 may be removed, and replaced by a resistor or current source.

Figure 11:
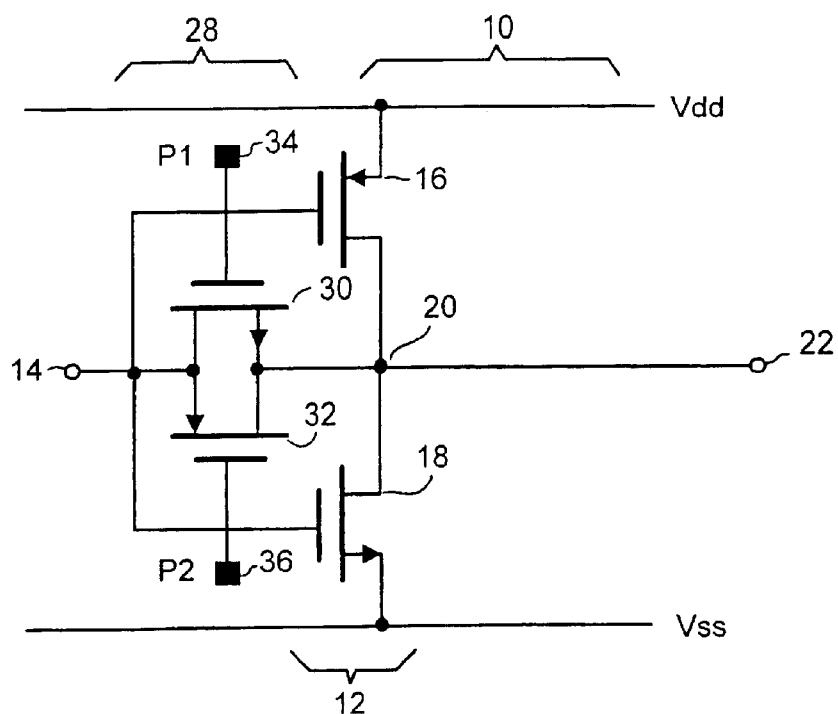
FIG. 11 is a circuit diagram of an amplifier circuit according to another aspect of the present invention.

FIG. 11 shows an alternative embodiment according to a further aspect of the invention, in which the third and fourth transistors 24, 26 may be removed, providing that the feedback loop has the fifth and sixth transistors 30, 32. In this case, the fifth and sixth transistors 30, 32 act as a load to the output 22, and define the gain of the amplifier. They also define the input resistance as shown in FIG. 5.

Figure 12:
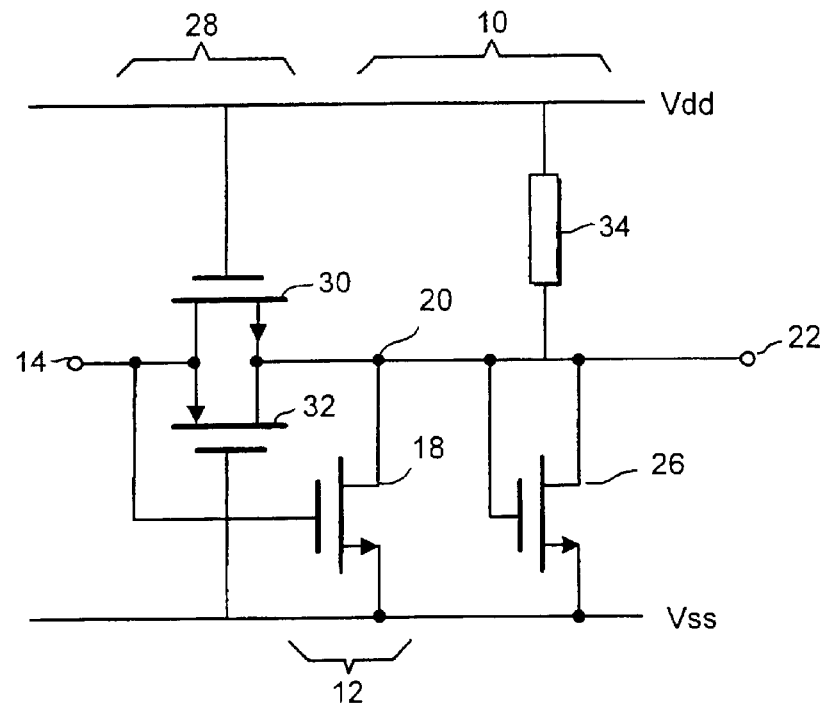
FIG. 12 is a circuit diagram of an amplifier circuit according to another aspect of the present invention.

FIG. 12 shows an alternative embodiment according to a third aspect of the invention, in which the first and third transistors 16 and 24 of FIG. 3 are removed, and replaced with a resistor 34 connected between Vdd and the output 22. Alternatively, the transistors 16, 24 could be replaced with a current source (not shown), rather than a resistor 34.

Figure 13:
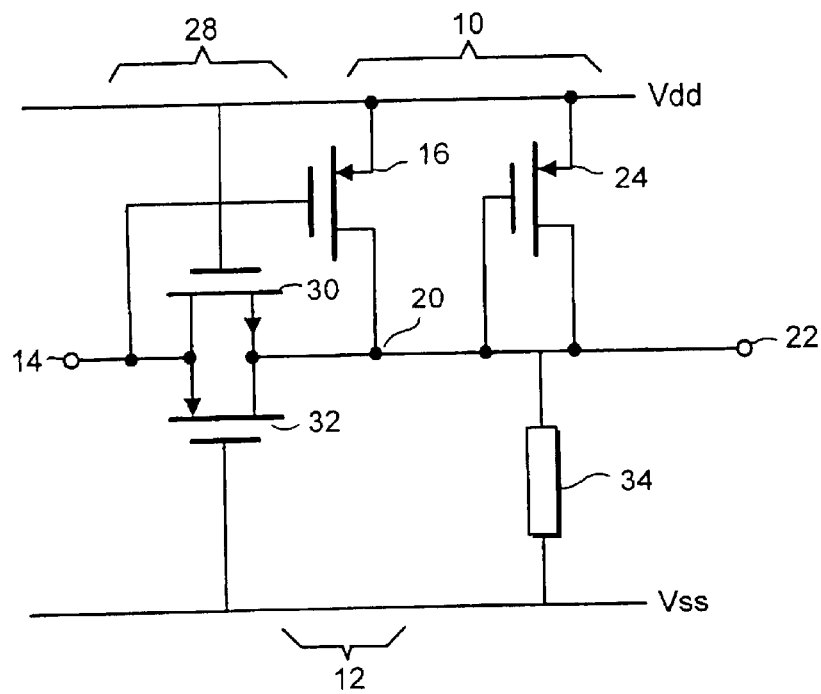
FIG. 13 is a circuit diagram of an amplifier circuit according to another aspect of the present invention.

In a further embodiment according to a fourth aspect of the invention, as shown in FIG. 13, the second and fourth transistors 18 and 26 of FIG. 3 are removed, (ie. a mirror of FIG. 12), and replaced with a resistor 34. As above, the transistors 18, 26 could also be replaced with a current source (not shown), rather than a resistor 34.

The circuit has been described herein with reference to its fabrication using CMOS techniques. However, it will be recognised that any form of field MOS devices may be used in the circuit.

Thus, the circuit can act as an amplifier with optimum power transfer to the output, yet with low noise.

Moreover, the circuit can be used to provide general input impedance termination, for example being designed with unity gain, or with any desired gain, but with its input impedance being controllable as described above.

What is claimed is:

1. A method of amplifying a low noise RF communication signal by applying the signal to an amplifier circuit comprising:

receiving the signal by a circuit input;

receiving the signal from the circuit input by a gain stage, the gain stage having an inverter including an inverter input, the gain stage comprising first and second MOS transistors;

providing first and second supply voltages to the first and second MOS transistors, respectively, the first and second MOS transistors being connected between the first and second supply voltages, providing an inverter output current by an inverter output to a load circuit, the inverter output current corresponding to a circuit input voltage, the load circuit comprising a first resistive element, the first resistive element comprising at least a third MOS transistor, connected to the inverter output and to the first supply voltage;

providing, by the load circuit, a voltage output corresponding to the inverter output current;

applying a first voltage, by a first voltage source, to a gate of at least a fourth MOS transistor such that the fourth MOS transistor operates in a linear region, the fourth MOS transistor having a drain and source terminals connected between a circuit output and the circuit input, the fourth MOS transistor operating as a second resistive element and being comprised in a feedback circuit;

determining the active input impedance of the amplifier circuit; and adjusting a feedback resistance of the feedback circuit such that the active input impedance of the amplifier is set to a required value.

2. A method as claimed in claim 1, wherein the load circuit further comprises a third resistive element comprising a fifth MOS transistor connected between the circuit output and the second supply voltage, the method further comprising:

providing the first and second supply voltages to the respective source terminals of the third and fifth transistors.

3. A method as claimed in claim 1, wherein the second resistive element comprises the fourth MOS transistor and a sixth MOS transistor, the fourth and sixth transistors being of opposite conductivity types, and each having a drain-source path connected between the circuit output and the circuit input, the method further comprising:

providing the first voltage and a second voltage from the first voltage source and a second voltage source to gates of the fourth and sixth transistors respectively.

4. An amplifier circuit for amplifying a low noise RF communication signal, the amplifier comprising:

a circuit input, and a circuit output;

an inverter, comprising at least a first MOS transistor connected between the circuit output and a first supply voltage, and having an inverter input connected to the circuit input, and an inverter output, and providing an inverter output current corresponding to a circuit input voltage;

a first resistive element, comprising a second MOS transistor, having a gate and a drain connected to the inverter output and to the circuit output, and a source connected to the first supply voltage, providing a voltage output corresponding to the inverter output current;

a second resistive element, comprising third and fourth MOS transistors, the third and fourth transistors being of opposite conductivity types, and each having a drain-source path connected between the circuit output and the circuit input, and having a gate connected to a respective voltage source; and, a third resistive element connected between the circuit output and a second supply voltage, wherein the third resistive element has a different structure than the first resistive element.

5. An amplifier circuit as claimed in claim 4, wherein the inverter comprises the first MOS transistor and a fifth MOS transistor connected between the first and second supply voltages.

6. An amplifier circuit as claimed in claim 4, wherein the third resistive elements is a resistor.

7. An amplifier circuit as claimed in claim 4, wherein the third resistive element is a current source.

8. An amplifier circuit as claimed in claim 4, wherein the respective voltage source is adjustable.

9. An amplifier circuit as claimed in claim 4, wherein the respective voltage source is the first and second supply voltages.

10. An amplifier circuit as claimed in claim 4, wherein the MOS transistors are CMOS devices.

* * * * *